United States Patent
Ogami et al.

(10) Patent No.: US 10,751,806 B2
(45) Date of Patent: Aug. 25, 2020

(54) SURFACE-COATED CUTTING TOOL HAVING EXCELLENT CHIPPING RESISTANCE AND WEAR RESISTANCE

(71) Applicant: MITSUBISHI MATERIALS CORPORATION, Tokyo (JP)

(72) Inventors: Tsuyoshi Ogami, Naka (JP); Tatsuo Hashimoto, Akashi (JP); Natsuki Ichimiya, Tokyo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 163 days.

(21) Appl. No.: 16/082,867

(22) PCT Filed: Mar. 10, 2017

(86) PCT No.: PCT/JP2017/009738
§ 371 (c)(1),
(2) Date: Sep. 6, 2018

(87) PCT Pub. No.: WO2017/155096
PCT Pub. Date: Sep. 14, 2017

(65) Prior Publication Data
US 2019/0039147 A1  Feb. 7, 2019

(30) Foreign Application Priority Data
Mar. 11, 2016  (JP) ................................. 2016-047919

(51) Int. Cl.
*B23B 27/14* (2006.01)
*C23C 14/06* (2006.01)
(Continued)

(52) U.S. Cl.
CPC ............ *B23B 27/148* (2013.01); *B23B 27/14* (2013.01); *B23B 51/00* (2013.01); *B23C 5/16* (2013.01);
(Continued)

(58) Field of Classification Search
USPC .......... 51/307, 309; 428/216, 336, 697, 698, 428/699, 704
See application file for complete search history.

(56) References Cited

U.S. PATENT DOCUMENTS

| | | | |
|---|---|---|---|
| 2008/0075976 A1 | 3/2008 | Yamamoto et al. | |
| 2009/0130465 A1* | 5/2009 | Vetter | C23C 14/06 428/448 |

(Continued)

FOREIGN PATENT DOCUMENTS

| | | |
|---|---|---|
| CN | 1876368 A | 12/2006 |
| CN | 101578396 A | 11/2009 |

(Continued)

OTHER PUBLICATIONS

European Search Report dated Oct. 1, 2019 for the corresponding European Patent Application No. 17763428.4.

(Continued)

*Primary Examiner* — Archene A Turner
(74) *Attorney, Agent, or Firm* — Leason Ellis LLP

(57) ABSTRACT

Provided is a surface-coated cutting tool including: a cutting tool body and a hard coating layer on a surface of the cutting tool body, wherein the hard coating layer includes a complex nitride layer of Al, Cr, Si, and Cu, the complex nitride layer of Al, Cr, Si, and Cu includes a main phase, and CrSi-rich particles and Al-rich particles that are dispersed in the main phase, the main phase satisfies $0.15 \leq \alpha \leq 0.40$, $0.05 \leq \beta \leq 0.20$, $0.005 \leq \gamma \leq 0.05$, and $0.45 \leq x \leq 0.60$, the CrSi-rich particles satisfy $0.20 \leq \alpha \leq 0.55$, $0.20 \leq \beta \leq 0.55$, $0 \leq \gamma \leq 0.10$, and $0.02 \leq x \leq 0.35$, the Al-rich particles satisfy $0.10 \leq \alpha \leq 0.25$, $0.05 \leq \beta \leq 0.25$, $0 \leq \gamma \leq 0.10$, and $0.02 \leq x \leq 0.35$ in a composition formula: $(Al_{1-\alpha-\beta-\gamma}Cr_\alpha Si_\beta Cu_\gamma)_{1-x}N_x)$, and an occupancy area ratio of the CrSi-rich particles having a major axis of 100 nm or more is 0.20 to 2.0 area %; and an occupancy area ratio (Continued)

of the Al-rich particles having a major axis of 100 nm or more is 0.50 to 3.0 area %.

4 Claims, 3 Drawing Sheets

(51) Int. Cl.
    *B23F 21/00*     (2006.01)
    *B23C 5/16*     (2006.01)
    *B23B 51/00*     (2006.01)

(52) U.S. Cl.
    CPC .............. *B23F 21/00* (2013.01); *C23C 14/06* (2013.01); *C23C 14/0641* (2013.01); *B23B 2226/125* (2013.01); *B23B 2228/105* (2013.01)

(56) References Cited

U.S. PATENT DOCUMENTS

| | | | | |
|---|---|---|---|---|
| 2011/0183131 A1* | 7/2011 | Maeda | ................... | B23F 21/00 428/216 |
| 2015/0291800 A1 | 10/2015 | Soebisch et al. | | |

FOREIGN PATENT DOCUMENTS

| | | | |
|---|---|---|---|
| CN | 101879794 | A | 11/2010 |
| CN | 104178680 | A | 12/2014 |
| CN | 104313572 | A | 1/2015 |
| JP | 2004-050381 | A | 2/2004 |
| JP | 3781374 | B | 5/2006 |
| JP | 2008-031517 | A | 2/2008 |
| JP | 2008-073800 | A | 4/2008 |
| JP | 2016-500752 | A | 1/2016 |
| WO | WO-2016/021581 | A | 2/2016 |
| WO | WO-2016/117681 | A1 | 7/2016 |
| WO | WO-2017/073653 | A | 5/2017 |
| WO | WO-2017/073655 | A | 5/2017 |

OTHER PUBLICATIONS

Office Action dated Jun. 19, 2019 for the corresponding Chinese Patent Application No. 201780015585.6.
International Search Report dated Jun. 6, 2017 for the corresponding PCT International Application No. PCT/JP2017/009738.

* cited by examiner

SURFACE-COATED CUTTING TOOL HAVING EXCELLENT CHIPPING RESISTANCE AND WEAR RESISTANCE

CROSS-REFERENCE TO RELATED PATENT APPLICATIONS

This application is a U.S. National Phase Application under 35 U.S.C. § 371 of International Patent Application No. PCT/JP2017/009738, filed Mar. 10, 2017, and claims the benefit of Japanese Patent Application No. 2016-047919, filed on Mar. 11, 2016, all of which are incorporated herein by reference in their entirety. The International Application was published in Japanese on Sep. 14, 2017 as International Publication No. WO/2017/155096 under PCT Article 21(2).

FIELD OF THE INVENTION

The present invention relates to a surface-coated cutting tool (hereinafter, referred to as coated tool) in which a hard coating layer exhibits excellent chipping resistance and wear resistance during cutting work of a high hardness material such as hardened steel, and excellent cutting performance is exhibited for a long-term usage.

BACKGROUND OF THE INVENTION

In general, as coated tools, throw-away tips which are detachably attached to the tip portion of an insert holder to be used for turning or planing a work material such as various kinds of steel and cast iron, drills or miniature drills used for drilling or the like of the work material, end mills used for facing, grooving, shoulder milling, and the like of the work material, solid hobs and pinion cutters used for gear cutting of the work material into tooth shapes, and the like are known.

In addition, various suggestions have hitherto been made for the purpose of improving the cutting performance of coated tools.

For example, as described in Japanese Patent No. 3781374, a coated tool is suggested in which a surface of a cutting tool body made of tungsten carbide (hereinafter, referred to as WC)-based cemented carbide, titanium carbonitride (hereinafter, referred to as TiCN)-based cermet, or the like is coated with one or more hard layers having a cubic structure composed of a metal component primarily containing Cr, Al, and Si and at least one element selected from C, N, O, and B such that the fracturing resistance and wear resistance are improved.

In addition, Japanese Unexamined Publication No. 2008-31517 describes a coated tool in which a surface of a cutting tool body is coated with a hard coating layer, and at least one layer of a hard film is represented by $(M_aL_b)X_c$ (where, M represents at least one metal element selected from Cr, Al, Ti, Hf, V, Zr, Ta, Mo, W and Y, L represents at least one additive element selected from Mn, Cu, Ni, Co, B, Si, and S, X represents at least one non-metallic element selected from C, N and O, a represents an atomic ratio of M to the sum of M and L, b represents an atomic ratio of L to the sum of M and L, c represents an atomic ratio of X to the sum of M and L, and a, b, and c satisfy $0.85 \leq a \leq 0.99$, $0.01 \leq b \leq 0.15$, $a+b=1$, and $1.00 < c \leq 1.20$), respectively. As a result, crystal grain refinement and crystal stability are achieved by Cu, Si, and the like which are the components of the hard film, and thus high-temperature hardness is increased, wear resistance is improved, and oxidation resistance is improved.

Further, Japanese Unexamined Publication No. 2004-50381 discloses a coated tool in which a hard coating layer formed of a complex nitride of Cr and Al is formed by physical vapor deposition on a surface of a cutting tool body. In the coated tool, the hard coating layer has a component concentration distribution structure in which a highest Al content point and a lowest Al content point are alternately and present repeatedly at predetermined intervals in a layer thickness direction and an Al content continuously changes between the highest Al content point and the lowest Al content point, the highest Al content point satisfies a composition formula: $(Cr_{1-x}Al_x)N$ (where X represents 0.40 to 0.60 in terms of atomic ratio), the lowest Al content point satisfies a composition formula: $(Cr_{1-y}Al_y)N$ (where Y represents 0.05 to 0.30 in terms of atomic ratio), and the interval between the highest Al content point and the lowest Al content point adjacent to each other is 0.01 to 0.1 µm. As a result, the hard coating layer exhibits excellent chipping resistance under heavy cutting conditions.

Technical Problem

An improvement in performance of a machine tool in recent years has been remarkable, and there has been a strong demand for power saving and energy saving during cutting work and a further reduction in cost. In accordance with this, there is a trend toward a further increase in speed and efficiency during cutting work. However, there is no particular problem in a case where the coated tool of the related art is used for cutting work of steel, cast iron, or the like under typical cutting conditions. However, in a case where the coated tool of the related art is used for cutting work during which high-temperature heat is generated and high impact and intermittent loads are exerted on a cutting edge, for example, for high-speed milling of a high hardness material such as hardened steel, the occurrence of chipping and fracturing cannot be suppressed. Furthermore, wear progression is promoted. Therefore, in the current situation, the coated tool of the related art reaches the end of its service life within a relatively short period of time.

For example, in the coated tool of the related art described in Japanese Patent No. 3781374, an Al component of an (Al, Cr, Si)N layer forming the hard coating layer has an effect of improving high-temperature hardness, a Cr component of the (Al, Cr, Si)N layer has an effect of improving high-temperature toughness and high-temperature strength and improving high-temperature oxidation resistance in a state in which Al and Cr coexist with each other, and a Si component of the (Al, Cr, Si)N layer has an effect of improving heat-resistant plastic deformability. However, under cutting conditions under which high-temperature heat is generated and high impact and intermittent loads are exerted on a cutting edge, the occurrence of chipping, fracturing, and the like cannot be avoided. For example, even in a case where there is an attempt to improve the high-temperature toughness and high-temperature strength by increasing the Cr content ratio, the wear resistance deteriorates due to a relative reduction in the Al content ratio. Therefore, there is a limitation on the improvement in the chipping resistance and wear resistance of the hard coating layer formed of the (Al, Cr, Si)N layer.

In addition, in the coated tools of the related art described in Japanese Unexamined Publication No. 2008-31517, it is suggested that crystal grain refinement is achieved by adding Cu as a component of the hard coating layer such that the wear resistance is improved. However, while the wear resistance is improved, the toughness deteriorates such that the occurrence of chipping cannot be suppressed, and the tool life is short.

Further, in the coated tool of the related art described in Japanese Unexamined Publication No. 2004-50381, the composition modulated structure in which the composition concentration repeatedly changes in the hard coating layer is formed, and high-temperature hardness and heat resistance are achieved by the highest Al content point (corresponding to a lowest Cr content point). On the other hand, the strength of the hard coating layer is secured by the lowest Al content point (corresponding to a lowest Cr content point) adjacent to the highest Al content point (corresponding to the lowest Cr content point) such that chipping resistance and wear resistance are secured. However, although the coated tool of the related art is effective to some extent for cutting work of ordinary steel, alloy steel, or cast iron, it cannot be said that chipping resistance and wear resistance are sufficient for cutting work of a high hardness material (for example, HRC 60 or more) due to high impact and intermittent loads exerted on a cutting edge.

SUMMARY OF THE INVENTION

Solution to Problem

Therefore, from the above-described viewpoints, the present inventors intensively conducted researches to develop a coated tool in which a hard coating layer exhibits excellent chipping resistance and wear resistance under cutting conditions under which high-temperature heat is generated and high impact and intermittent loads are exerted on a cutting edge, for example, during high-speed milling of a high hardness material such as hardened steel, while focusing on components that forms the hard coating layer and a layer structure thereof. As a result, the following knowledge was obtained.

That is, the present inventors found the following phenomena: that wear resistance is improved due to crystal grain refinement by adding Cu as a component of a hard coating layer formed of an (Al, Cr, Si)N layer to form a hard coating layer formed of a complex nitride layer of Al, Cr, Si, and Cu (hereinafter, also referred to as "(Al, Cr, Si, Cu)N layer") on a surface of a cutting tool body; and that the (Al, Cr, Si, Cu)N layer exhibits excellent chipping resistance and wear resistance by causing two kinds of particles having different compositions, specifically, CrSi-rich particles and Al-rich particles to coexist with each other in the hard coating layer formed of the (Al, Cr, Si, Cu)N layer and furthermore setting area ratios of the two kinds of particles in the hard coating layer to be in specific ranges, respectively.

In addition, the present inventors found that, even under cutting conditions under which high-temperature heat is generated and high impact and mechanical loads are exerted on a cutting edge, for example, during intermittent cutting work of a high hardness material such as hardened steel, excellent chipping resistance and wear resistance can be achieved without the occurrence of peeling and the like by providing a lower layer for improving the adhesive strength between the (Al, Cr, Si, Cu)N layer and the cutting tool body or forming an intermediate layer between the lower layer and the (Al, Cr, Si, Cu)N layer to further improve the adhesive strength.

The (Al, Cr, Si, Cu)N layer, the lower layer, and the intermediate layer can be formed on the surface of the cutting tool body using a PVD method.

For example, each of the layers can be formed using, for example, an arc ion plating (hereinafter, referred to as "AIP") apparatus (1) that is schematically shown in FIG. 3. In particular, during the formation of the (Al, Cr, Si, Cu)N layer, by controlling deposition conditions thereof, in particular, the magnitudes of a magnetic flux density and an arc current applied to a target, the CrSi-rich particles and the Al-rich particles having the predetermined area ratios can be caused to coexist with each other in the (Al, Cr, Si, Cu)N layer.

In addition, it was found that the CrSi-rich particles having the predetermined area ratio present in the (Al, Cr, Si, Cu)N layer contribute to improvement of high-temperature strength in the layer and that the Al-rich particles having the predetermined area ratio present in the (Al, Cr, Si, Cu)N layer contribute to improvement of oxidation resistance.

As a result, in the coated tool according to the present invention in which the hard coating layer is formed, excellent chipping resistance and wear resistance during intermittent cutting work of a high hardness material such as hardened steel during which high impact and mechanical loads are exerted on a cutting edge, and excellent cutting performance is exhibited for a long-term usage.

The present invention is made based on the above-described knowledge and has the following aspects.

(1) A surface-coated cutting tool including: a cutting tool body made of any of tungsten carbide-based cemented carbide, titanium carbonitride-based cermet, a cubic boron nitride-based sintered material, and high-speed tool steel; and a hard coating layer that is provided on a surface of the cutting tool body, wherein (a) the hard coating layer includes at least a complex nitride layer of Al, Cr, Si, and Cu, (b) the complex nitride layer of Al, Cr, Si, and Cu includes a main phase, and CrSi-rich particles and Al-rich particles that are dispersed in the main phase, in a case where each of compositions of the main phase, the CrSi-rich particles, and the Al-rich particles are represented by a composition formula: $(Al_{1-\alpha-\beta-\gamma}Cr_\alpha Si_\beta Cu_\gamma)_{1-x}N_x$ (where each of $\alpha$, $\beta$, $\gamma$, and x represents an atomic ratio), (c) a composition of the main phase satisfies $0.15 \leq \alpha \leq 0.40$, $0.05 \leq \beta \leq 0.20$, $0.005 \leq \gamma \leq 0.05$, and $0.45 \leq x \leq 0.60$, (d) a composition of the CrSi-rich particles satisfy $0.20 \leq \alpha \leq 0.55$, $0.20 \leq \beta \leq 0.55$, $0 \leq \gamma \leq 0.10$, and $0.02 \leq x \leq 0.35$, (e) a composition of the Al-rich particles satisfy $0.10 \leq \alpha \leq 0.25$, $0.05 \leq \beta \leq 0.25$, $0 \leq \gamma \leq 0.10$, and $0.02 \leq x \leq 0.35$, and (f) in a case where a vertical section of the complex nitride layer of Al, Cr, Si, and Cu is observed, an occupancy area ratio of the CrSi-rich particles having a major axis of 100 nm or more in the vertical section is 0.20 area % or more and 2.0 area % or less; and an occupancy area ratio of the Al-rich particles having a major axis of 100 nm or more in the vertical section is 0.50 area % or more and 3.0 area % or less.

(2) The surface-coated cutting tool according to (1), wherein in a case where particles having a major axis of 100 nm or more are observed in the vertical section of the complex nitride layer of Al, Cr, Si, and Cu, an area ratio of particles having a sectional aspect ratio of 2 or more is 80 area % or more with respect to a total area of the particles having a major axis of 100 nm or more.

(3) The surface-coated cutting tool according to (1) or (2), wherein the complex nitride layer of Al, Cr, Si, and Cu is provided as an upper layer, a lower layer made of a complex nitride layer of Al, Ti, and Si is provided between the cutting tool body and the upper layer, and in a case where the lower layer is represented by a composition formula: $(Al_{1-a-b}Ti_aSi_b)_{1-y}N_y$, a composition of the lower layer satisfies $0.30 \leq a \leq 0.50$, $0.01 \leq b \leq 0.10$, and $0.45 \leq y \leq 0.60$ (where each of a, b, and y represents an atomic ratio).

(4) The surface-coated cutting tool according to (3), wherein an intermediate layer having an alternately laminated structure of a thin layer A and a thin layer B is provided between the lower layer and the upper layer, (a) in a case where the thin layer A is represented by a composition formula: $(Al_{1-\alpha-\beta-\gamma}Cr_\alpha Si_\beta Cu_\gamma)_{1-x}N_x$, a composition of the thin layer A satisfies $0.15 \leq \alpha \leq 0.40$, $0.05 \leq \beta \leq 0.20$, $0.005 \leq \gamma \leq 0.05$, and $0.45 \leq x \leq 0.60$ (where each of $\alpha$, $\beta$, $\gamma$, and x represents an atomic ratio) and the thin layer A is formed of a complex nitride layer of Al, Cr, Si, and Cu with an average one-layer thickness of 0.005 to 0.10 µm, and (b) in a case where the thin layer B is represented by a composition formula: $(Al_{1-a-b}Ti_aSi_b)_{1-y}N_y$, a composition of the thin layer B satisfies $0.30 \leq a \leq 0.50$, $0.01 \leq b \leq 0.10$, and $0.45 \leq y \leq 0.60$ (where each of a, b, and y represents an atomic ratio) and the thin layer B is formed of a complex nitride layer of Al, Ti, and Si with an average one-layer thickness of 0.005 to 0.10 µm.

Advantageous Effects of Invention

In the coated tool according to the aspect of the present invention (hereinafter, referred to as "coated tool according to the present invention"), the (Al, Cr, Si, Cu)N layer of the hard coating layer includes a main phase, and CrSi-rich particles and Al-rich particles that are dispersed in the main phase, each of the main phase, the CrSi-rich particles, and the Al-rich particles has a predetermined composition, an occupancy area ratio of the CrSi-rich particles having a major axis of 100 nm or more in a vertical section of the (Al, Cr, Si, Cu)N layer is 0.20 area % or more and 2.0 area % or less, and an occupancy area ratio of the Al-rich particles in the vertical section is 0.50 area % or more and 3.00 area % or less. Therefore, even in a case where the coated tool according to the present invention is used for intermittent cutting work of a high hardness material or the like during which high impact and mechanical loads are exerted on a cutting edge, excellent chipping resistance and wear resistance are exhibited for a long-term usage. Further, in the coated tool according to the present invention, in a case where particles having a major axis of 100 nm or more in the (Al, Cr, Si, Cu)N layer are observed, an area ratio of particles having a sectional aspect ratio of 2 or more is 80 area % or more with respect to a total area of the particles having a major axis of 100 nm or more, the (Al, Cr, Si, Cu)N layer is provided as the upper layer (UL), the lower layer formed of the (Al, Ti, Si)N layer having high adhesive strength is provided between the cutting tool body and the upper layer, and the intermediate layer is provided between the lower layer and the upper layer in order to further improve the adhesive strength. As a result, even in a case where the coated tool according to the present invention is used for intermittent cutting work of a high hardness material or the like, excellent chipping resistance and wear resistance can be exhibited for a long-term usage without peeling of the hard coating layer.

Figure 2:
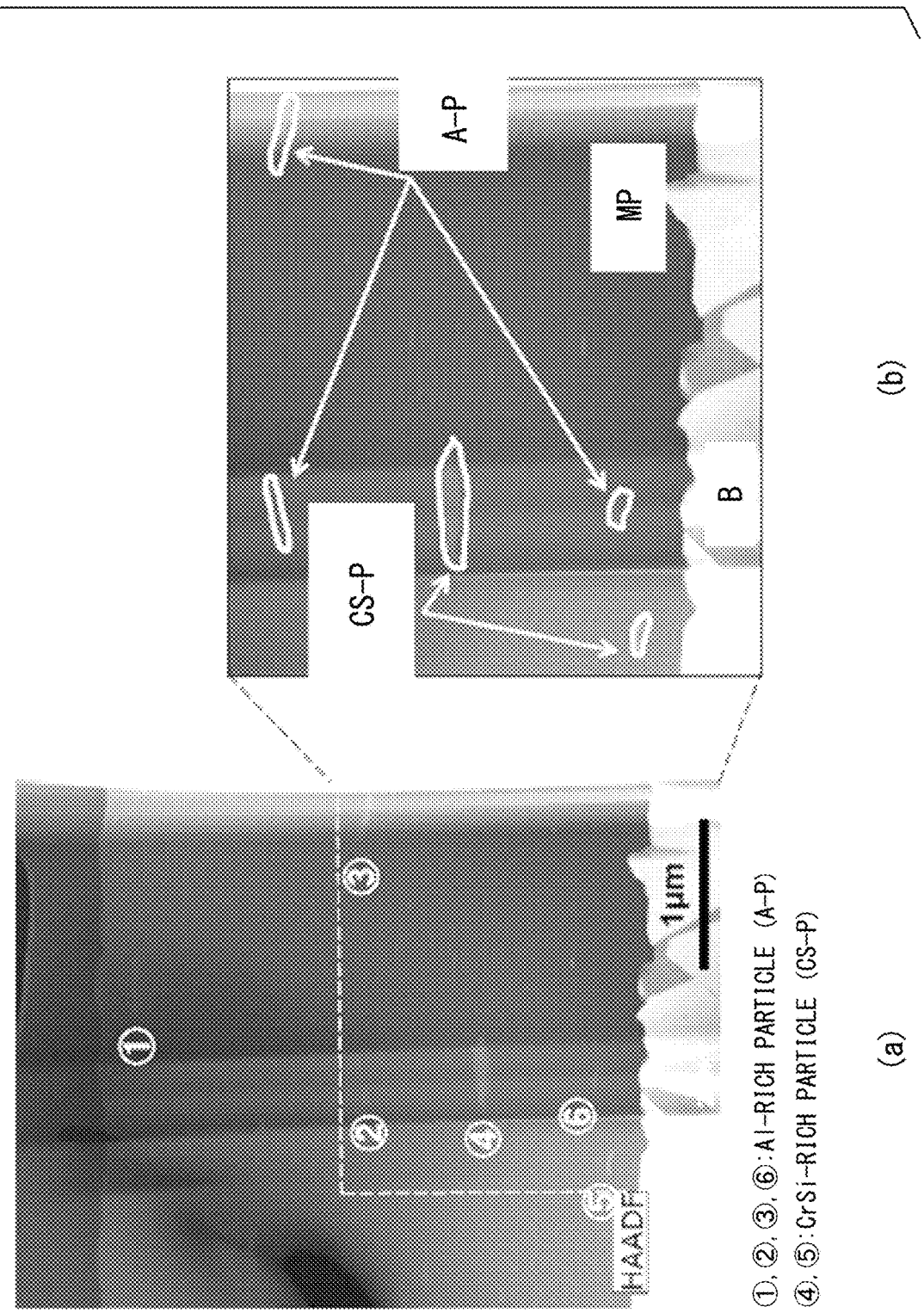

(a) of FIG. 2 is an example of a HAADF-STEM image illustrating an (Al, Cr, Si, Cu)N layer of the coated tool according to the present invention in which CrSi-rich particles and Al-rich particles are dispersed and (b) of FIG. 2 is a partially enlarged view of the HAADF-STEM image, in which, among numerical characters surrounded by circles, 1, 2, 3, and 6 represent Al-rich particles (A-P) and 4 and 5 represent CrSi-rich particles.

Figure 3A:
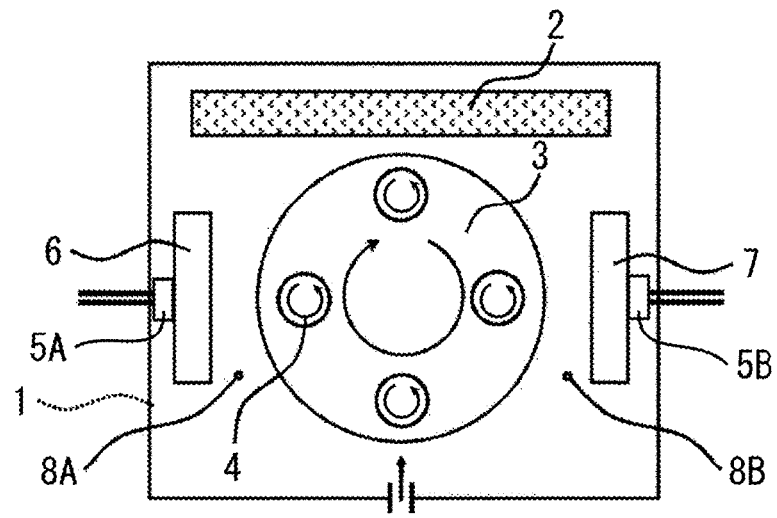

FIG. 3A is a plan view schematically illustrating an arc ion plating apparatus that forms a hard coating layer in a coated tool according to Example 2 of the present invention.

Figure 3B:
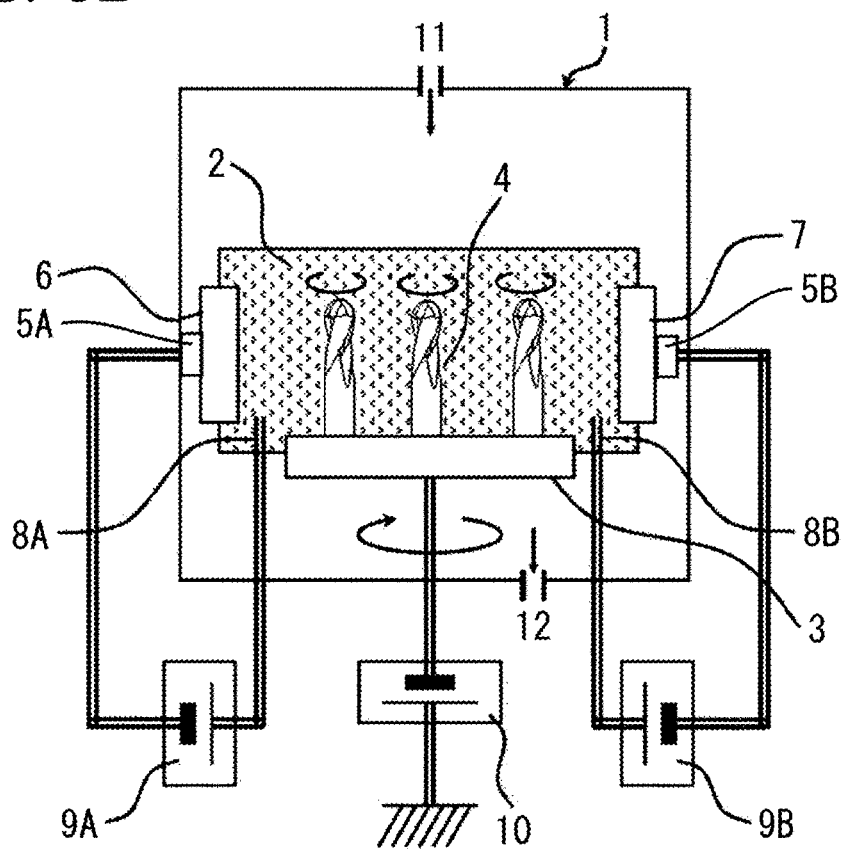

FIG. 3B is a side view schematically illustrating the arc ion plating apparatus that forms the hard coating layer in the coated tool according to Example 2 of the present invention.

DETAILED DESCRIPTION OF THE INVENTION

An embodiment of the present invention will be described below in detail.

(Al, Cr, Si, Cu)N Layer:

A hard coating layer of a coated tool according to the present invention includes at least an (Al, Cr, Si, Cu)N layer, in which an Al component of the (Al, Cr, Si, Cu)N layer has an effect of improving high-temperature hardness, a Cr component of the (Al, Cr, Si, Cu)N layer has an effect of improving high-temperature toughness and high-temperature strength and improving high-temperature oxidation resistance in a state in which Al and Cr coexist with each other, a Si component of the (Al, Cr, Si, Cu)N layer has an effect of improving heat-resistant plastic deformability, and a Cu component of the (Al, Cr, Si, Cu)N layer has an effect of improving wear resistance by refining crystal grains.

Figure 1A:
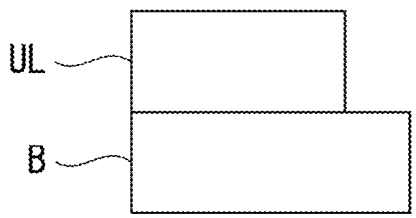
FIG. 1A is a schematic vertical cross-sectional view illustrating one aspect of a hard coating layer of a coated tool according to the present invention.

In one aspect, as illustrated in a schematic diagram of FIG. 1A, the hard coating layer of the coated tool according to the present invention has a single-layer structure including the (Al, Cr, Si, Cu)N layer.

Figure 1B:
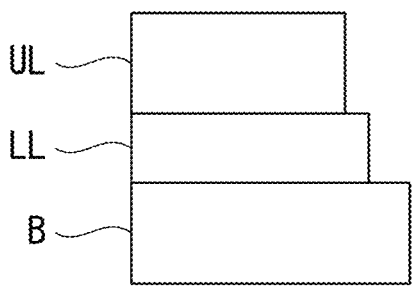
FIG. 1B is a schematic vertical cross-sectional view illustrating another aspect of the hard coating layer of the coated tool according to the present invention.
Figure 1C:
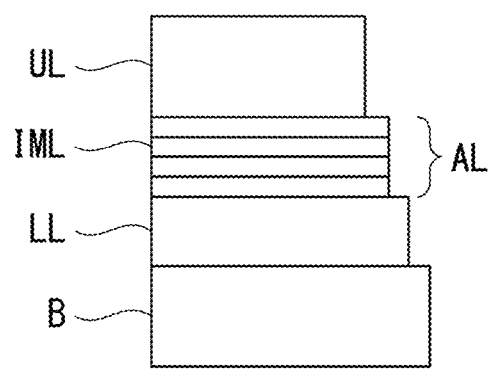
FIG. 1C is a schematic vertical cross-sectional view illustrating still another aspect of the hard coating layer of the coated tool according to the present invention.

In addition, in another aspect, as illustrated in a schematic diagram of FIG. 1B, the hard coating layer has a two-layer structure including: a lower layer (LL) that is formed of a layer of a complex nitride of Al, Ti, and Si (hereinafter, also referred to as "(Al, Ti, Si)N"); and an upper layer (UL) that is formed of the (Al, Cr, Si, Cu)N layer. Further, in still another aspect, as illustrated in a schematic diagram of FIG. 1C, the hard coating layer has a three-layer structure including: a lower layer (LL) that is formed of (Al, Ti, Si)N; an upper layer (UL) that is formed of the (Al, Cr, Si, Cu)N layer; and an intermediate layer (IML) that is formed between the lower layer and the upper layer and has an alternately laminated (AL) structure of a thin layer A and a thin layer B. Irrespective of whether the hard coating layer has the single-layer structure, the two-layer structure, or the three-layer structure, the (Al, Cr, Si, Cu)N layer is formed of a main phase (MP), and CrSi-rich particles (CS-P) and Al-rich particles (A-P) that are dispersed in the main phase.

The CrSi-rich particles (CS-P) and the Al-rich particles (A-P) described herein refer to macroparticles that are formed in the main phase (MP) and in which the N content is low with respect to the main phase.

In the present invention, the layer thickness of the (Al, Cr, Si, Cu)N layer is not particularly limited. But, in a case where the layer thickness of the (Al, Cr, Si, Cu)N layer is less than 0.5 µm, sufficient wear resistance can be exhibited for a long period of time. On the other hand, in a case where the layer thickness of the (Al, Cr, Si, Cu)N layer is more than 8.0 µm, a residual compressive stress accumulating in the hard coating layer increases. Therefore, chipping is likely to occur on a cutting edge during initial cutting, and the hard coating layer itself may self-destruct.

Accordingly, the layer thickness of the (Al, Cr, Si, Cu)N layer is preferably 0.5 µm or more and 8.0 µm or less.

Although not particularly limited thereto, the layer thickness of the (Al, Cr, Si, Cu)N layer is more preferably 1.5 µm or more and 5.5 µm or less. The layer thickness of the (Al, Cr, Si, Cu)N layer is still more preferably 2.0 µm and more and 4.5 µm or less.

Compositions of the main phase, the CrSi-rich particles, and the Al-rich particles of the (Al, Cr, Si, Cu)N layer are represented by a composition formula: $(Al_{1-\alpha-\beta-\gamma}Cr_\alpha Si_\beta Cu_\gamma)_{1-x}N_x$ (where each of $\alpha$, $\beta$, $\gamma$, and x represents an atomic ratio).

Main Phase of (Al, Cr, Si, Cu)N Layer:

In addition, in a case where an $\alpha$ value (atomic ratio) representing the average composition of Cr in the main phase (MP) of the (Al, Cr, Si, Cu)N layer is lower than 0.15 in terms of a ratio thereof to the total content of Al, Si, and Cu, the minimum required high-temperature toughness and high-temperature strength cannot be secured. Therefore, the occurrence of chipping and fracturing cannot be suppressed. On the other hand, in a case where the $\alpha$ value is higher than 0.40, wear progression is promoted due to a relative reduction in the Al content ratio. Therefore, the $\alpha$ value is set to 0.15 to 0.40.

In addition, in a case where a P value (atomic ratio) representing the average composition of Si is lower than 0.05 in terms of a ratio thereof to the total content of Al, Cr, and Cu, the improvement in wear resistance due to the improvement in heat-resistant plastic deformability cannot be expected. On the other hand, in a case where the 0 value is higher than 0.20, there is a trend toward a reduction in the effect of improving the wear resistance. Therefore, the β value is set to 0.05 to 0.20.

Furthermore, in a case where a γ value (atomic ratio) representing the average composition of Cu is lower than 0.005 in terms of a ratio thereof to the total content of Al, Cr, and Si, the improvement in wear resistance cannot be expected. In a case where the γ value is higher 0.05, an excess number of coarse particles are likely to be formed when the (Al, Cr, Si, Cu)N layer is formed using an arc ion plating (hereinafter, referred to as "AIP") apparatus, and chipping resistance deteriorates during cutting work during which high impact and mechanical loads are exerted. Therefore, the γ value is set to 0.005 to 0.05.

Preferable ranges of the $\alpha$, $\beta$, and γ values are $0.15 \leq \alpha \leq 0.25$, $0.05 \leq \beta \leq 0.15$, and $0.01 \leq \gamma \leq 0.03$, respectively.

In the main phase (MP) formed of the (Al, Cr, Si, Cu)N layer, a content ratio x of a N component to the total content of the components forming the main phase (MP) is not particularly limited 0.50 as a stoichiometric ratio and may be in a range of $0.45 \leq x \leq 0.60$ that is a range where equivalent effects to those of the stoichiometric ratio can be obtained.

CrSi-Rich Particles and Al-Rich Particles in (Al, Cr, Si, Cu)N Layer:

In the (Al, Cr, Si, Cu)N layer, the CrSi-rich particles (CS-P) and the Al-rich particles (A-P) (refer to FIG. 2) that are dispersed in the main phase are formed.

As illustrated in FIG. 2, the CrSi-rich particles and the Al-rich particles (A-P) that are dispersed in the main phase (MP) are formed in a flat shape in which directions of major axes of substantially all the particles are substantially parallel to a surface of a cutting tool body.

During the formation of the CrSi-rich particles (CS-P) and the Al-rich particles (A-P), each of the particles can be made to have a desired composition by controlling deposition conditions under which the AlCrSiCuN layer is deposited using an AIP apparatus (1) illustrated in FIG. 3, in particular, controlling the magnitudes of a magnetic flux density and an arc current applied to a target. Further, in a section of the (Al, Cr, Si, Cu)N layer, an area ratio of particles having a sectional major axis of 100 nm or more among the particles present in the main phase can be made to be a desired value.

CrSi-Rich Particles:

The CrSi-rich particles (CS-P) are dispersed in the main phase to improve high-temperature strength such that chipping resistance during cutting is improved.

In a case where the composition of the CrSi-rich particles (CS-P) is represented by a composition formula: $(Al_{1-\alpha-\beta-\gamma}Cr_\alpha Si_\beta Cu_\gamma)_{1-x}N_x$ (where each of $\alpha$, $\beta$, $\gamma$, and x represents an atomic ratio), when the composition of the CrSi-rich particles is outside of the ranges of $0.20 \leq \alpha \leq 0.55$, $0.20 \leq \beta \leq 0.55$, $0 \leq \gamma \leq 0.10$, and $0.02 \leq x \leq 0.35$, the high-temperature strength is not sufficient. Therefore, chipping is likely to occur due to high impact and intermittent loads during intermittent cutting work of a high hardness material such as hardened steel.

In a case where the Cr content $\alpha$ is lower than 0.20, a sufficient strength for the main phase cannot be obtained, and the effect of suppressing chipping due to the improvement of high-temperature strength that is exhibited during the dispersing in the main phase is reduced. On the other hand, in a case where the Cr content is higher than 0.55, the particles are substantially spherical, voids are likely to remain below the particles, and cracks initiate from the voids, which causes chipping.

In a case where the Si content ratio 0 is lower than 0.20, the heat-resistant plastic deformability of the particles can be secured. In a case where the Si content ratio 0 is higher than 0.55, the heat-resistant plastic deformability deteriorates.

In a case where the Cu content is higher than 0.10, the hardness of the particles is reduced, the hardness of the film as a whole in which the CrSi-rich particles are dispersed is reduced, and the minimum required wear resistance cannot be obtained.

Preferable ranges of the $\alpha$, $\beta$, and γ values are $0.25 \leq \alpha \leq 0.50$, $0.25 \leq \beta \leq 0.50$, and $0 \leq \gamma \leq 0.08$, respectively.

In a case where the N content x is lower than 0.02, affinity to the main phase deteriorates, and cracks initiate from interfaces between the particles and the main phase. In addition, in a case where N content x is higher than 0.35, the effects of the particles are not exhibited.

Al-Rich Particles:

The Al-rich particles (A-P) are dispersed in the main phase to improve the oxidation resistance of the hard coating layer. As a result, the wear resistance is improved.

In a case where the composition of the Al-rich particles (A-P) is represented by a composition formula: $(Al_{1-\alpha-\beta-\gamma}Cr_\alpha Si_\beta Cu_\gamma)_{1-x}N_x$ (where each of $\alpha$, $\beta$, $\gamma$, and x represents an atomic ratio), when the composition of the Al-rich particles is outside of the ranges of $0.10 \leq \alpha \leq 0.25$, $0.05 \leq \beta \leq 0.25$, $0 \leq \gamma \leq 0.10$, and $0.02 \leq x \leq 0.35$, the effect of improving oxidation resistance is not sufficient. Therefore, the effect of improving wear resistance cannot be expected.

In a case where the Cr content $\alpha$ is lower than 0.10, the high-temperature oxidation resistance of the particles deteriorate. On the other hand, in a case where the Cr content is higher than 0.25, wear progression is promoted due to a relative reduction in the Al content ratio.

In a case where the Si content β is lower than 0.05, the minimum required heat-resistant plastic deformability cannot be obtained. In a case where the Si content (3 is higher than 0.25, wear progression is promoted due to a relative reduction in the Al content ratio as in the case of Cr.

In a case where the Cu content is higher than 0.10, the hardness of the particles is reduced, and the wear resistance cannot be obtained.

Preferable ranges of the α, β, and γ values are $0.10 \leq \alpha \leq 0.20$, $0.05 \leq \beta \leq 0.20$, and $0 \leq \gamma \leq 0.08$, respectively.

In a case where the N content x is lower than 0.02, affinity to the main phase deteriorates, and cracks initiate from interfaces between the particles and the main phase. In addition, in a case where N content x is higher than 0.35, the effects of the particles are not exhibited.

The compositions of the CrSi-rich particles (CS-P) and the Al-rich particles (A-P) that are dispersed in the main phase can be measured by transmission electron microscopy energy-dispersive X-ray spectroscopy (TEM-EDS).

In the present invention, the (Al, Cr, Si, Cu)N layer is formed of the main phase (MP), the CrSi-rich particles (CS-P) and the Al-rich particles (A-P) that are dispersed in the main phase. As a result, the (Al, Cr, Si, Cu)N layer exhibits excellent chipping resistance and wear resistance. However, the characteristics of the (Al, Cr, Si, Cu)N layer are affected by the area ratios of the CrSi-rich particles (CS-P) and the Al-rich particles (A-P) present in the (Al, Cr, Si, Cu)N layer. Therefore, it is important to maintain the area ratios of the particles in the (Al, Cr, Si, Cu)N layer to be in appropriate ranges. The (Al, Cr, Si, Cu)N layer of the hard coating layer of the coated tool according to the present invention is deposited using the AIP apparatus (1) and under the controlled deposition conditions (the magnitudes of a magnetic flux density and an arc current applied to a target). As a result, the main phase is formed, and the CrSi-rich particles (CS-P) and the Al-rich particles (A-P) are dispersed and formed in the main phase.

In a case where a vertical section of the (Al, Cr, Si, Cu)N layer is observed, the CrSi-rich particles (CS-P) and the Al-rich particles (A-P) that are dispersed in the main phase (MP) are formed in a flat shape in which directions of major axes thereof are substantially parallel to the surface of the cutting tool body.

Regarding the particles, in a case where an area ratio of particles having a major axis of 100 nm or more in the vertical section of the (Al, Cr, Si, Cu)N layer is obtained, the area ratio of the CrSi-rich particles (CS-P) is 0.20 area % or more and 2.00 area % or less, and the area ratio of the Al-rich particles (A-P) is 0.50 area % or more and 3.00 area % or less.

The reason for this is as follows. In a case where the area ratio of the CrSi-rich particles (CS-P) in the vertical section of the (Al, Cr, Si, Cu)N layer is lower than 0.20 area %, the effect of suppressing chipping is not sufficiently obtained. On the other hand, in a case where the area ratio of the CrSi-rich particles (CS-P) is higher than 2.00 area %, the hardness of the coating as a whole is reduced, and the wear resistance is reduced. In addition, in a case where the area ratio of the Al-rich particles (A-P) is lower than 0.50 area %, the effect of improving wear resistance due to the particles cannot be sufficiently obtained. On the other hand, in a case where the area ratio of the Al-rich particles (A-P) is higher than 3.00 area %, the chipping resistance of the coating as a whole is reduced.

Further, in a case where a major axis and a minor axis of each of the particles having a major axis of 100 nm or more are measured to obtain an aspect ratio during the observation of the vertical section of the (Al, Cr, Si, Cu)N layer, it is preferable that an area ratio of particles having a sectional aspect ratio of 2 or more is 80 area % or more with respect to a total area of the particles having a major axis of 100 nm or more.

The reason for this is as follows. The shape of the particles having an aspect ratio of lower than 2 is substantially spherical, voids are likely to remain below the particles, and cracks initiate from the voids, which causes chipping. Due to the reason, in a case where the area ratio of the particles having an aspect ratio of 2 or more is lower than 80 area %, a large number of substantially spherical particles from which cracks initiate are present, and chipping resistance deteriorates.

The area and the aspect ratio of each of the particles can be obtained using the following measuring and calculating method.

In a TEM-EDS mapping image in which each of the particles is imaged, a boundary between a particle and the main phase is specified to select an outer circumferential portion of the particle using a mapping image in which the nitrogen content is analyzed, and the area surrounding the particle is calculated using image analyzing software (for example, Adobe Photoshop). As a result, the area of the particle can be calculated.

In addition, a major axis of a particle refers to the longest diameter among measured diameters of a sectional shape of an upper layer section of the particle perpendicular to the surface of the cutting tool body. In the present invention, directions of major axes of substantially all the particles are substantially parallel to the surface of the cutting tool body. Therefore, the longest length of each of the particles measured in a direction parallel to the surface of the cutting tool body will be referred to as the major axis, and the longest length of the particle perpendicular to the major axis direction will be referred to as the minor axis.

The aspect ratio can be obtained as a value of major axis/minor axis.

Composition of (Al, Ti, Si)N Layer Forming Lower Layer of Thin Layer B of Intermediate Layer In the coated tool according to the present invention, the (Al, Cr, Si, Cu)N layer is provided as the upper layer (UL), and the lower layer (LL) formed of the (Al, Ti, Si)N layer is provided between the cutting tool body (B) and the upper layer (UL). As a result, the hard coating layer can be formed as a layer having a two-layer structure.

Further, by providing the intermediate layer (IML) between the lower layer (LL) and the upper layer (LL), the hard coating layer can be formed as a layer having a three-layer structure. The intermediate layer (IML) is formed of the thin layer A and the thin layer B, the thin layer A is formed of the (Al, Cr, Si, Cu)N layer having the same component composition as the main phase (MP) of the upper layer (UL), and the thin layer B is formed of the (Al, Ti, Si)N layer having the same component composition as the lower layer.

In the (Al, Ti, Si)N layer forming the lower layer (LL) or the thin layer B of the intermediate layer (IML), the Al component and the Si component improve wear resistance, and the Ti component improves high-temperature toughness and high-temperature strength.

Further, the (Al, Ti, Si)N layer has high adhesive strength with the cutting tool body (B) and has high adhesive strength with the upper layer (UL) or the thin layer A of the intermediate layer (IML). Therefore, in a case where high impact and mechanical loads are exerted during cutting work, the peeling resistance of the hard coating layer is improved.

In a case where the composition of the (Al, Ti, Si)N layer is represented by a composition formula: $(Al_{1-a-b}Ti_aSi_b)_{1-y}N_y$, it is preferable that the (Al, Ti, Si)N layer satisfies 0.30≤a≤0.50, 0.01≤b≤0.10, and 0.45≤y≤0.60 (where each of a, b, and y represents an atomic ratio).

The reason for this is as follows. In a case where an a value (atomic ratio) representing the content ratio of Ti to the total content of Al, Ti, and Si is lower than 0.30, the effect of improving high-temperature toughness and high-temperature strength cannot be expected. On the other hand, in a case where the α value is higher than 0.50, the minimum required high-temperature hardness and high-temperature oxidation resistance cannot be secured due to a relative reduction in the content ratios of the Al component and the Si component. In addition, in a case where a b value (atomic ratio) representing the content ratio of Si to the total content of Al, Ti, and Si is lower than 0.01, the minimum required predetermined high-temperature hardness, high-temperature oxidation resistance, and heat-resistant plastic deformability cannot be secured, which causes deterioration of wear resistance. In addition, in a case where the b value is higher than 0.10, the effect of improving wear resistance tends to be reduced.

Accordingly, it is preferable that the a value (atomic ratio) representing the Ti content ratio is 0.30 to 0.50 and the b value (atomic ratio) representing the Si content ratio is 0.01 to 0.10.

Desirable ranges of the a and b values are 0.35≤a≤0.42 and 0.035≤b≤0.08.

A content ratio y (atomic ratio) of an N component to the total content of the components forming the (Al, Ti, Si)N layer is not particularly limited 0.50 as a stoichiometric ratio and may be in a range of 0.45≤y≤0.60 that is a range where equivalent effects to those of the stoichiometric ratio can be obtained.

Average Layer Thickness of Lower Layer:

The lower layer (LL) has an effect of improving the adhesive strength between the surface of the cutting tool body and the upper layer (UL) or the intermediate layer (IML). In a case where the layer thickness of the lower layer (LL) is less than 0.3 μm, the effect of improving the adhesive strength cannot be obtained. On the other hand, in a case where the layer thickness is more than 3.0 μm, cracking is likely to occur due to accumulation of residual compressive stress, and the adhesive strength cannot be stably secured. Therefore, the layer thickness of the lower layer (LL) is preferably 0.3 to 3.0 μm and more preferably 0.5 to 2.0 μm.

Average Total Layer Thickness of Intermediate Layer and Average One-Layer Thickness of Thin Layer A and Thin Layer B:

In the coated tool according to the present invention, in order to improve the adhesive strength between the upper layer (UL) formed of the (Al, Cr, Si, Cu)N layer and the cutting tool body (B), the lower layer (LL) formed of the (Al, Ti, Si)N layer can be formed on the surface of the cutting tool body. In order to further improve the adhesive strength between the upper layer (UL) and the lower layer (LL), the intermediate layer (IML) having the alternately laminated (AL) structure of the thin layer A and the thin layer B can be formed between the upper layer (UL) and the lower layer (LL).

Here, the thin layer A is formed of, for example, the (Al, Cr, Si, Cu)N layer having the same component composition as the main phase (MP) of the upper layer (UL), and the thin layer B is formed of, for example, the (Al, Ti, Si)N layer having the same component composition as the lower layer (LL).

In a case where the average one-layer thickness of each of the thin layer A and the thin layer B is less than 0.005 μm, it is difficult to clearly form each of the thin layers to have a predetermined composition, and the effect of improving wear resistance obtained by the thin layer A and the effect of improving toughness and peeling resistance obtained by the thin layer B are not exhibited. On the other hand, in a case where the one-layer thickness of each of the thin layer A or the thin layer B is more than 0.10 μm, defects of each of the thin layers locally appear in the layer. That is, the strength of the thin layer A is locally insufficient, and the wear resistance of the thin layer B is locally insufficient, which may lead to deterioration in the characteristics of the intermediate layer as a whole and further the hard coating layer as a whole. Therefore, the average one-layer thickness of each of the thin layer A and the thin layer B is preferably 0.005 to 0.10 μm.

That is, the thin layer B is provided in order to compensate for insufficient characteristics among the characteristics of the thin layer A. In a case where the layer thickness of each of the thin layer A and the thin layer B is in a range of 0.005 to 0.10 μm, the hard coating layer having the alternately laminated structure of the thin layer A and the thin layer B functions as one layer that has excellent high-temperature hardness, high-temperature toughness, and high-temperature strength, and improves the adhesive strength between the upper layer and the lower layer. In a case where the layer thickness of each of the thin layer A and the thin layer B is more than 0.10 μm, the strength of the thin layer A is insufficient, and the wear resistance of the thin layer B is insufficient.

In addition, in a case where the average total layer thickness of the intermediate layer (IML) having the alternately laminated (AL) structure of the thin layer A and the thin layer B is less than 0.1 μm, excellent characteristics cannot be exhibited. In addition, in a case where the average total layer thickness is more than 1.0 μm, chipping or fracturing is likely to occur. The average total layer thickness of the intermediate layer having the alternately laminated structure of the thin layer A and the thin layer B is preferably 0.1 to 1.0 μm and more preferably 0.2 to 0.5 μm.

Next, the coated tool of the present invention will be described in more detail with reference to examples.

In the following Examples, a case where the coated tool according to the present invention was used for milling will be described. However, the use of the coated tool according to the present invention for turning or drilling is not excluded.

In addition, a case where WC-based cemented carbide was used as a cutting tool body will be described. However, the present invention is also applicable to a case where TiCN-based cermet, a cubic boron nitride-based sintered material, or high-speed tool steel is used as a cutting tool body.

Example 1

As base powders, medium coarse WC powder having an average particle size of 5.5 m, fine WC powder having an average particle size of 0.8 m, a TaC powder having an average particle size of 1.3 μm, NbC powder having an average particle size of 1.2 μm, ZrC powder having an average particle size of 1.2 m, $Cr_3C_2$ powder having an average particle size of 2.3 µm, VC powder having an average particle size of 1.5 µm, (Ti, W)C [TiC/WC=50/50 in mass ratio] powder having an average particle size of 1.0 µm, and Co powder having an average particle size of 1.8 m were prepared. These base powders were mixed with each other according to mixing compositions shown in Table 1, respectively. Further, wax was added thereto, and the components were mixed in acetone using a ball mill for 24 hours, and the mixture was dried under reduced pressure and extruded and pressed into various green compacts having predetermined shapes under a pressure of 100 MPa. The green compacts were heated to a predetermined temperature in a range of 1370° C. to 1470° C. at a temperature increase rate of 7° C./min in a vacuum atmosphere at 6 Pa, were held at this temperature for one hour, and were sintered under furnace cooling conditions. As a result, round bar sintered materials for forming cutting tool bodies having a diameter of 10 mm were formed. Further, by grinding the round bar sintered materials, each of cutting tool bodies (end mills) 1 to 3 made of WC-based cemented carbide having a cutting edge portion with a dimension (diameter×length) of 6 mm×12 mm and having a two-edge ball shape with a helix angle of 30 degrees was manufactured.

(a) Each of the cutting tool bodies 1 to 3 was mounted along an outer circumferential portion at a position at a predetermined distance from a central axis of a rotation table of an AIP apparatus in a radial direction, and a target (cathode electrode) formed of an Al—Cr—Si—Cu alloy having a predetermined composition was disposed in the AIP apparatus.

(b) First, while the inside of the apparatus was evacuated and held in a vacuum, the cutting tool body was heated to 400° C. using a heater. Next, a direct current bias voltage of −1000 V was applied to the cutting tool body that was rotating while revolving on the rotation table and a current of 100 A was caused to flow between a Ti metal cathode electrode and an anode electrode such that arc discharge was generated. As a result, bombardment cleaning was performed on the surface of the cutting tool body.

(c) Next, a magnetic field controlled to various maximum magnetic flux densities shown in Table 2 was applied to a surface of an Al—Cr—Si—Cu alloy target having a predetermined composition, nitrogen gas as reaction gas was introduced into the apparatus to adjust a nitrogen pressure as shown in Table 2, a direct current bias voltage shown in Table 2 was applied while maintaining the temperature of the cutting tool body that was rotating while revolving on the rotation table in a temperature range shown in Table 2, and an arc current shown in Table 2 was caused to flow between the Al—Cr—Si—Cu alloy target and the anode electrode such that arc discharge is generated. As a result, an (Al, Cr, Si, Cu)N layer in which a main phase having a composition and an average layer thickness as shown in Table 3 and CrSi-rich particles and Al-rich particles having compositions, area ratios, and an area ratio of particles having an aspect ratio of 2 or more as shown in Table 4 were present was deposited on the surface of the cutting tool body. This way, coated tools 1 to 10 according to the present invention including hard coating layers shown in Tables 3 and 4 were prepared.

The AIP apparatus described above has the same configuration as the AIP apparatus of FIG. 3, except that a target (cathode electrode) formed of Ti metal instead of an Al—Ti—Si alloy was disposed.

Regarding the (Al, Cr, Si, Cu)N layer of each of the coated tools 1 to 10 according to the present invention, structure observation and composition analysis of a section of each layer perpendicular to the surface of the cutting tool body were performed by transmission electron microscopy energy-dispersive X-ray spectroscopy (TEM-EDS).

In addition, regarding the (Al, Cr, Si, Cu)N layer of each of the coated tools 1 to 10 according to the present invention, in a visual field that was set to include the entire thickness region of the hard coating layer such that the width in a direction parallel to the surface of the cutting tool body was 20 m, element mapping was performed on an upper layer vertical section with a spatial resolution of 0.01 m or less so as to verify that the composition of the main phase of the coated (Al, Cr, Si, Cu)N layer was in the range defined by the present invention. Concurrently, the compositions of the CrSi-rich particles and the Al-rich particles in the upper layer vertical section were measured by point analysis.

In addition, the area ratios of the CrSi-rich particles and the Al-rich particles in the upper layer vertical section were obtained using the following method. In a TEM-EDS mapping image in which each of the particles was imaged, a boundary between a particle and the main phase was specified to select an outer circumferential portion of the particle using a mapping image in which the nitrogen content was analyzed, and the area surrounding the particle was calculated using image analyzing software (for example, Adobe Photoshop). As a result, the area ratio of the particle in a measurement region of the upper layer section was calculated.

The measurement of the area ratios of the CrSi-rich particles and the Al-rich particles was performed on only particles having a major axis of 100 nm or more. In addition, regarding each of the CrSi-rich particles and the Al-rich particles, the longest length in a direction parallel to the surface of the cutting tool body was measured as a major axis and the longest length in a direction perpendicular to the major axis direction was measured to obtain an aspect ratio (major axis/minor axis) of the particle. Next, an area ratio of particles having a major axis of 100 nm or more and an aspect ratio of 2 or more to the total area of the particles having a major axis of 100 nm or more was calculated.

Further, the layer thickness of the (Al, Cr, Si, Cu)N layer was measured using an electron scanning microscope (SEM).

Tables 3 and 4 show the measured values and the calculated values.

Next, for comparison, (Al, Cr, Si, Cu)N layer having compositions and desired average layer thicknesses as shown in Tables 6 and 7 were deposited on surfaces of the cutting tool bodies 1 to 3 using the AIP apparatus through the same steps as the steps (a) to (c) of Example 1 under conditions shown in Table 5. As a result, comparative coated tools 1 to 10 including the (Al, Cr, Si, Cu)N layers shown in Tables 6 and 7 were prepared.

Regarding the comparative coated tools 1 to 10, using the same methods as in Example 1, composition analysis of the (Al, Cr, Si, Cu)N layer was performed, the compositions of the particles present in the (Al, Cr, Si, Cu)N layer and the area ratio of the particles having an aspect ratio of 2 or more were measured and calculated, and the layer thickness of the (Al, Cr, Si, Cu)N layer was measured.

Tables 6 and 7 show the measured values and the calculated values.

TABLE 1

| Type | | Co | (Ti, W)C | TaC | NbC | ZrC | Cr₃C₂ | VC | WC | Diameter × Length of Cutting Edge Portion (mm) |
|---|---|---|---|---|---|---|---|---|---|---|
| | | | | Mixing Composition (mass %) | | | | | | |
| Cutting Tool Body | 1 | 5 | 5 | — | — | — | — | — | Medium Coarse Powder: Balance | 6 × 12 |
| | 2 | 6 | — | 1 | 0.5 | — | — | — | Fine Powder: Balance | 6 × 12 |
| | 3 | 6 | — | 1 | — | 1 | 0.5 | 0.5 | Fine Powder: Balance | 6 × 12 |

TABLE 2

| | | Deposition Conditions of (Al, Cr, Si, Cu)N Layer | | | | |
|---|---|---|---|---|---|---|
| Type | Cutting Tool Body Symbol | Temperature of Cutting Tool Body (°C.) | Nitrogen Partial Pressure (Pa) | Bias Voltage (−V) | Arc Current (A) | Maximum Magnetic Flux Density of Target Surface (mT) |
| Present Invention | 1 | 1 | 450 | 4.0 | 100 | 100 | 8.0 |
| | 2 | 2 | 450 | 6.7 | 50 | 100 | 12.0 |
| | 3 | 3 | 500 | 6.7 | 75 | 120 | 10.0 |
| | 4 | 1 | 550 | 6.7 | 50 | 120 | 12.0 |
| | 5 | 2 | 500 | 2.6 | 50 | 120 | 7.5 |
| | 6 | 3 | 550 | 4.0 | 100 | 100 | 7.5 |
| | 7 | 1 | 550 | 2.6 | 50 | 150 | 8.0 |
| | 8 | 2 | 500 | 4.0 | 75 | 150 | 10.0 |
| | 9 | 3 | 450 | 2.6 | 75 | 100 | 10.0 |
| | 10 | 1 | 450 | 4.0 | 100 | 100 | 10.0 |

TABLE 3

| | | Main Phase of (Al, Cr, Si, Cu)N Layer | | | | |
|---|---|---|---|---|---|---|
| | | Composition (Atomic Ratio) | | | | Average Layer Thickness (μm) |
| Type | | α Value | β Value | γ Value | x Value | |
| Present Invention | 1 | 0.18 | 0.10 | 0.020 | 0.49 | 3.0 |
| | 2 | 0.23 | 0.11 | 0.015 | 0.60 | 5.4 |
| | 3 | 0.24 | 0.20 | 0.010 | 0.54 | 0.5 |
| | 4 | 0.30 | 0.05 | 0.050 | 0.56 | 2.8 |
| | 5 | 0.15 | 0.06 | 0.020 | 0.48 | 4.0 |
| | 6 | 0.18 | 0.12 | 0.040 | 0.52 | 8.0 |
| | 7 | 0.25 | 0.15 | 0.030 | 0.45 | 3.5 |
| | 8 | 0.40 | 0.05 | 0.010 | 0.50 | 2.6 |
| | 9 | 0.22 | 0.11 | 0.005 | 0.51 | 1.2 |
| | 10 | 0.27 | 0.10 | 0.020 | 0.52 | 4.2 |

TABLE 4

| | | Particles of (Al, Cr, Si, Cu)N Layer | | | | | | | | | | Area Ratio (%) of Particles having Aspect Ratio of 2 or more |
|---|---|---|---|---|---|---|---|---|---|---|---|---|
| | | CrSi-Rich Particles | | | | | Al-Rich Particles | | | | | |
| | | Composition (Atomic Ratio) | | | | Area Ratio (%) | Composition (Atomic Ratio) | | | | Area Ratio (%) | |
| Type | | α Value | β Value | γ Value | x Value | | α Value | β Value | γ Value | x Value | | |
| Present Invention | 1 | 0.32 | 0.26 | 0.03 | 0.02 | 2.0 | 0.18 | 0.09 | 0.05 | 0.02 | 0.5 | 87 |
| | 2 | 0.28 | 0.55 | 0.02 | 0.35 | 1.8 | 0.14 | 0.12 | 0.03 | 0.10 | 2.1 | 98 |
| | 3 | 0.35 | 0.20 | 0.06 | 0.10 | 2.0 | 0.18 | 0.05 | 0.05 | 0.18 | 1.5 | 92 |
| | 4 | 0.20 | 0.40 | 0.02 | 0.05 | 1.5 | 0.10 | 0.21 | 0.03 | 0.35 | 1.9 | 92 |
| | 5 | 0.48 | 0.33 | 0.01 | 0.12 | 1.0 | 0.24 | 0.25 | 0.00 | 0.16 | 2.0 | 89 |
| | 6 | 0.33 | 0.46 | 0.10 | 0.28 | 1.6 | 0.13 | 0.16 | 0.10 | 0.21 | 1.8 | 90 |
| | 7 | 0.55 | 0.20 | 0.02 | 0.21 | 1.3 | 0.25 | 0.12 | 0.02 | 0.30 | 2.8 | 98 |
| | 8 | 0.41 | 0.33 | 0.00 | 0.17 | 0.2 | 0.20 | 0.24 | 0.01 | 0.35 | 2.0 | 85 |

TABLE 4-continued

Particles of (Al, Cr, Si, Cu)N Layer

| Type | CrSi-Rich Particles Composition (Atomic Ratio) α Value | β Value | γ Value | x Value | Area Ratio (%) | Al-Rich Particles Composition (Atomic Ratio) α Value | β Value | γ Value | x Value | Area Ratio (%) | Area Ratio (%) of Particles having Aspect Ratio of 2 or more |
|---|---|---|---|---|---|---|---|---|---|---|---|
| 9 | 0.55 | 0.24 | 0.01 | 0.10 | 0.5 | 0.23 | 0.16 | 0.08 | 0.02 | 0.5 | 80 |
| 10 | 0.28 | 0.52 | 0.08 | 0.28 | 0.8 | 0.22 | 0.19 | 0.02 | 0.18 | 3.0 | 96 |

TABLE 5

Deposition Conditions of (Al, Cr, Si, Cu)N Layer

| Type | | Cutting Tool Body Symbol | Temperature of Cutting Tool Body (° C.) | Nitrogen Partial Pressure (Pa) | Bias Voltage (−V) | Arc Current (A) | Maximum Magnetic Flux Density of Target Surface (mT) |
|---|---|---|---|---|---|---|---|
| Comparative Example | 1 | 1 | 450 | 4.0 | 25 | 100 | 1.0 |
| | 2 | 2 | 500 | 6.7 | 30 | 90 | 3.0 |
| | 3 | 3 | 550 | 2.6 | 50 | 80 | 3.0 |
| | 4 | 1 | 450 | 4.0 | 75 | 90 | 1.0 |
| | 5 | 2 | 550 | 2.6 | 25 | 80 | 0 |
| | 6 | 3 | 450 | 6.7 | 50 | 90 | 2.5 |
| | 7 | 1 | 500 | 4.0 | 50 | 100 | 2.5 |
| | 8 | 2 | 550 | 4.0 | 50 | 100 | 0 |
| | 9 | 3 | 550 | 1.3 | 50 | 100 | 0 |
| | 10 | 1 | 500 | 2.6 | 50 | 80 | 2.5 |

TABLE 6

Main Phase of (Al, Cr, Si, Cu)N Layer

| Type | | Composition (Atomic Ratio) α Value | β Value | γ Value | x Value | Average Layer Thickness (μm) |
|---|---|---|---|---|---|---|
| Comparative Example | 1 | 0.20 | 0.21 | 0.002 | 0.52 | 2.5 |
| | 2 | 0.26 | 0.17 | 0.025 | 0.50 | 8.5 |
| | 3 | 0.25 | 0.16 | 0.003 | 0.50 | 1.1 |
| | 4 | 0.18 | 0.05 | 0.095 | 0.55 | 0.3 |
| | 5 | 0.43 | 0.08 | 0.014 | 0.48 | 1.5 |
| | 6 | 0.23 | 0.12 | 0.020 | 0.62 | 2.6 |
| | 7 | 0.14 | 0.10 | 0.035 | 0.45 | 4.0 |
| | 8 | 0.30 | 0.01 | 0.020 | 0.51 | 0.5 |
| | 9 | 0.23 | 0.10 | 0.016 | 0.41 | 6.5 |
| | 10 | 0.22 | 0.04 | 0.061 | 0.53 | 1.4 |

TABLE 7

Particles of (Al, Cr, Si, Cu)N Layer

| Type | | CrSi-Rich Particles Composition (Atomic Ratio) α Value | β Value | γ Value | x Value | Area Ratio (%) | Al-Rich Particles Composition (Atomic Ratio) α Value | β Value | γ Value | x Value | Area Ratio (%) | Area Ratio (%) of Particles having Aspect Ratio of 2 or more |
|---|---|---|---|---|---|---|---|---|---|---|---|---|
| Comparative Example | 1 | 0.52 | 0.15 | 0.01 | 0.15 | 5.2 | 0.15 | 0.26 | 0.01 | 0.25 | 4.8 | 65 |
| | 2 | 0.54 | 0.23 | 0.03 | 0.22 | 0.1 | 0.11 | 0.35 | 0.03 | 0.32 | 2.7 | 76 |
| | 3 | 0.18 | 0.34 | 0.06 | 0.25 | 3.9 | 0.02 | 0.16 | 0.05 | 0.12 | 3.1 | 66 |
| | 4 | 0.55 | 0.18 | 0.01 | 0.10 | 3.0 | 0.13 | 0.25 | 0.02 | 0.36 | 4.2 | 81 |
| | 5 | 0.28 | 0.56 | 0.03 | 0.27 | 4.2 | 0.21 | 0.13 | 0.03 | 0.08 | 5.3 | 75 |
| | 6 | 0.38 | 0.29 | 0.12 | 0.01 | 1.2 | 0.18 | 0.09 | 0.04 | 0.01 | 0.1 | 78 |
| | 7 | 0.65 | 0.19 | 0.01 | 0.08 | 2.4 | 0.32 | 0.04 | 0.01 | 0.17 | 2.3 | 69 |
| | 8 | 0.50 | 0.19 | 0.02 | 0.11 | 3.0 | 0.34 | 0.19 | 0.02 | 0.30 | 4.3 | 65 |
| | 9 | 0.29 | 0.50 | 0.02 | 0.36 | 2.6 | 0.18 | 0.20 | 0.02 | 0.10 | 3.0 | 72 |
| | 10 | 0.43 | 0.30 | 0.03 | 0.14 | 1.7 | 0.03 | 0.13 | 0.13 | 0.28 | 2.8 | 70 |

Next, regarding the coated tools 1 to 10 according to the present invention and the comparative coated tools 1 to 10, a milling cutting test was performed under the following cutting conditions, and the wear width of a flank face of a cutting edge was measured.

<Cutting Conditions A>
Work material: a block material according to JIS SKH51 (HRC64)
Rotational speed: 5400/min
Cutting speed: 100 m/min
Depth of cut: ae 0.2 mm, ap 2.0 mm
Feed rate (per tooth): 0.05 mm/edge
Cutting fluid: air blow
Cutting length: 18 m <Cutting Conditions B>
Work material: a block material according to JIS SKD11 (HRC60)
Rotational speed: 5400/min
Cutting speed: 100 m/min
Depth of cut: ae 0.3 mm, ap 2.0 mm
Feed rate (per tooth): 0.04 mm/edge
Cutting fluid: air blow
Cutting length: 50 m
Table 8 shows the results of the cutting test.

formed of a lower layer and an upper layer, and coated tools 16 to 20 including a hard coating layer that was formed of a lower layer, an intermediate layer having an alternately laminated structure of a thin layer A and a thin layer B, and an upper layer were prepared.

(a) Each of the cutting tool bodies 1 to 3 was mounted along an outer circumferential portion at a position at a predetermined distance from a central axis of a rotation table of an AIP apparatus shown in FIG. 3 in a radial direction, a target (cathode electrode) formed of an Al—Ti—Si alloy having a predetermined composition was disposed on one side of the AIP apparatus, a target (cathode electrode) formed of an Al—Cr—Si—Cu alloy having a predetermined composition was disposed on another side of the AIP apparatus, and bombardment cleaning was performed on a surface of the cutting tool body under the same conditions as in Example 1.

(b) Next, nitrogen gas as reaction gas was introduced into the apparatus to adjust a nitrogen pressure as shown in Table 9, a direct current bias voltage shown in Table 9 was applied while maintaining the temperature of the cutting tool body that was rotating while revolving on the rotation table in a temperature range shown in Table 9, and an arc current shown in Table 9 was caused to flow between the Al—Ti—

TABLE 8

| Type | | Wear Width on Flank Face (mm) Cutting Conditions (A) | Wear Width on Flank Face (mm) Cutting Conditions (B) | Type | | Wear Width on Flank Face (mm) Cutting Conditions (A) | Wear Width on Flank Face (mm) Cutting Conditions (B) |
|---|---|---|---|---|---|---|---|
| Present Invention | 1 | 0.05 | 0.06 | Comparative Example | 1 | 15* | 35* |
| | 2 | 0.08 | 0.10 | | 2 | 0.18 | 0.20 |
| | 3 | 0.06 | 0.06 | | 3 | 16* | 45* |
| | 4 | 0.10 | 0.12 | | 4 | 12* | 35* |
| | 5 | 0.12 | 0.05 | | 5 | 0.20 | 0.19 |
| | 6 | 0.06 | 0.08 | | 6 | 0.18 | 40* |
| | 7 | 0.08 | 0.07 | | 7 | 15* | 35* |
| | 8 | 0.10 | 0.08 | | 8 | 10* | 20* |
| | 9 | 0.08 | 0.06 | | 9 | 13* | 40* |
| | 10 | 0.06 | 0.05 | | 10 | 10* | 25* |

(In the table, (*) in the columns of Comparative Example represents the cutting length (m) until it reached to the service life (Wear Width on Flank Face: 0.2 mm) due to chipping or wear)

The following was found from the results shown in Tables 3, 4, and 6 to 8. In the coated tools 1 to 10 according to the present invention, the main phase having the predetermined composition and the CrSi-rich particles and the Al-rich particles having the predetermined compositions and the predetermined area ratios were present in the hard coating layer formed of the (Al, Cr, Si, Cu)N layer. As a result, excellent chipping resistance and wear resistance were exhibited during intermittent cutting work of a high hardness material during which high impact and intermittent loads were exerted on a cutting edge.

On the other hand, in the comparative coated tools 1 to 10, the composition of the main phase or the compositions and area ratios of the respective particles in the hard coating layer are outside of the ranges of the present invention. Therefore, it cannot be said that chipping resistance or wear resistance is excellent.

Example 2

Using the cutting tool bodies 1 to 3 used in Example 1 and the following method, coated tools 11 to 15 according to the present invention including a hard coating layer that was Si alloy target and the anode electrode such that arc discharge is generated. As a result, a lower layer formed of an (Al, Ti, Si)N layer having a composition and a desired average layer thickness as shown in Table 12 was deposited on the surface of the cutting tool body.

(c) Next, nitrogen gas as reaction gas was introduced into the apparatus to adjust a nitrogen pressure as shown in Table 10, a direct current bias voltage shown in Table 10 was applied while maintaining the temperature of the cutting tool body that was rotating while revolving on the rotation table in a temperature range shown in Table 10, and an arc current shown in Table 10 was caused to flow between the Al—Cr—Si—Cu alloy target and the anode electrode such that arc discharge is generated. As a result, a thin layer A formed of an (Al, Cr, Si, Cu)N layer having a composition and an average one-layer thickness as shown in Table 12 was deposited on a surface of the lower layer.

Concurrently, an arc current shown in Table 10 was caused to flow between the Al—Ti—Si alloy cathode electrode and the anode electrode such that arc discharge is generated. As a result, a thin layer B formed of an (Al, Ti, Si)N layer having a composition and an average one-layer thickness as shown in Table 12 was deposited, and thus an intermediate layer having an alternately laminated structure of the thin layer A and the thin layer B and having a predetermined average total layer thickness shown in Table 12 was deposited.

(d) Next, a magnetic field controlled to various maximum magnetic flux densities shown in Table 11 was applied to the surface of the Al—Cr—Si—Cu alloy target 11, nitrogen gas as reaction gas was introduced into the apparatus to adjust a nitrogen pressure as shown in Table 11, a direct current bias voltage shown in Table 11 was applied while maintaining the temperature of the cutting tool body that was rotating while revolving on the rotation table in a temperature range shown in Table 11, and an arc current shown in Table 11 was caused to flow between the Al—Cr—Si—Cu alloy target and the anode electrode such that arc discharge is generated. As a result, an upper layer in which a main phase having a composition and a desired average layer thickness as shown in Table 13 and CrSi-rich particles and Al-rich particles having compositions, area ratios, and an area ratio of particles having an aspect ratio of 2 or more as shown in Table 13 were present was deposited on the surface of the intermediate layer, and thus coated tools 11 to 20 according to the present invention including the hard coating layer that was formed of the lower layer, the intermediate layer, and the upper layer as shown in Tables 12 and 13 were prepared.

Regarding the coated tools 11 to 15 according to the present invention, the step (c) was not performed, and the intermediate layer was not formed.

Regarding the lower layer and the upper layer of each of the coated tools 11 to 15 according to the present invention and the lower layer, the intermediate layer, and the upper layer of each of the coated tools 16 to 20 according to the present invention, structure observation and composition analysis of a vertical section of each layer perpendicular to the surface of the cutting tool body were performed by transmission electron microscopy energy-dispersive X-ray spectroscopy (TEM-EDS).

In addition, regarding the thin layer A of the intermediate layer and the upper layer of each of the coated tools 16 to 20 according to the present invention, composition analysis was performed using the same method as in Example 1. In addition, in a case where particles are present, the compositions of the particles, the area ratio of the particles, and the area ratio of particles having an aspect ratio of 2 or more were measured and calculated.

Tables 12 and 13 show the measured values and the calculated values.

In addition, the layer thicknesses of the upper layer and the lower layer of each of the coated tools 11 to 20 according to the present invention were measured using an electron scanning microscope (SEM). Further, the average layer thickness of the thin layer A and the thin layer B in the intermediate layer was obtained by measuring the layer thicknesses of arbitrary five points in a visual field using a transmission electron microscope (TEM) and obtaining the average value thereof.

Tables 12 and 13 show the measured values and the calculated values.

TABLE 9

| | | | Deposition Conditions of Lower Layer | | | |
|---|---|---|---|---|---|---|
| Type | | Cutting Tool Body Symbol | Temperature of Cutting Tool Body (° C.) | Nitrogen Partial Pressure (Pa) | Bias Voltage (−V) | Arc Current (A) |
| Present Invention | 11 | 1 | 450 | 6.7 | 25 | 80 |
| | 12 | 2 | 450 | 4.0 | 50 | 80 |
| | 13 | 3 | 500 | 4.0 | 75 | 100 |
| | 14 | 1 | 550 | 4.0 | 50 | 80 |
| | 15 | 2 | 450 | 6.7 | 50 | 100 |
| | 16 | 3 | 550 | 2.6 | 25 | 100 |
| | 17 | 1 | 500 | 2.6 | 25 | 90 |
| | 18 | 2 | 450 | 2.6 | 50 | 80 |
| | 19 | 3 | 550 | 2.6 | 50 | 90 |
| | 20 | 1 | 500 | 6.7 | 75 | 90 |

TABLE 10

| | | | Deposition Conditions of Intermediate Layer | | | | |
|---|---|---|---|---|---|---|---|
| | | | Deposition Conditions of Thin Layer A and Thin Layer B | | | | |
| Type | | Cutting Tool Body Symbol | Temperature of Cutting Tool Body (° C.) | Nitrogen Partial Pressure (Pa) | Bias Voltage (−V) | Arc Current of Thin Layer A (A) | Arc Current of Thin Layer B (A) |
| Present Invention | 11 | 1 | 450 | 2.6 | 75 | 80 | 100 |
| | 12 | 2 | 450 | 4.0 | 75 | 80 | 90 |
| | 13 | 3 | 500 | 4.0 | 50 | 100 | 120 |
| | 14 | 1 | 550 | 4.0 | 50 | 80 | 90 |
| | 15 | 2 | 450 | 6.7 | 25 | 100 | 150 |
| | 16 | 3 | 550 | 2.6 | 25 | 100 | 150 |
| | 17 | 1 | 500 | 2.6 | 30 | 90 | 120 |
| | 18 | 2 | 450 | 6.7 | 30 | 80 | 100 |
| | 19 | 3 | 550 | 6.7 | 25 | 90 | 120 |
| | 20 | 1 | 500 | 6.7 | 50 | 90 | 100 |

TABLE 11

| Type | | Cutting Tool Body Symbol | Deposition Conditions of Upper Layer: Temperature of Cutting Tool Body (° C.) | Nitrogen Partial Pressure (Pa) | Bias Voltage (−V) | Arc Current (A) | Maximum Magnetic Flux Density of Target Surface (mT) |
|---|---|---|---|---|---|---|---|
| Present Invention | 11 | 1 | 550 | 2.6 | 50 | 150 | 8.0 |
| | 12 | 2 | 450 | 4.0 | 100 | 100 | 8.0 |
| | 13 | 3 | 550 | 4.0 | 100 | 100 | 7.5 |
| | 14 | 1 | 450 | 4.0 | 100 | 100 | 10.0 |
| | 15 | 2 | 500 | 6.7 | 75 | 120 | 10.0 |
| | 16 | 3 | 500 | 2.6 | 50 | 120 | 7.5 |
| | 17 | 1 | 450 | 2.6 | 75 | 100 | 10.0 |
| | 18 | 2 | 450 | 6.7 | 50 | 100 | 12.0 |
| | 19 | 3 | 550 | 6.7 | 50 | 120 | 12.0 |
| | 20 | 1 | 500 | 4.0 | 75 | 150 | 10.0 |

TABLE 12

| | | Lower Layer | | | | Intermediate Layer | | | | | | | | | |
|---|---|---|---|---|---|---|---|---|---|---|---|---|---|---|---|
| | | | | | | Thin Layer A | | | | | Thin Layer B | | | | |
| | | Composition (Atomic Ratio) | | | Average Layer | Composition (Atomic Ratio) | | | | Average One-Layer Thickness of | Composition (Atomic Ratio) | | | Average One-Layer Thickness of | Average Total Layer Thickness of Intermediate |
| Type | | a Value | b Value | c Value | Thickness (μm) | α Value | β Value | γ Value | x Value | Thin Layer A (μm) | a Value | b Value | c Value | Thin Layer B (μm) | Layer (μm) |
| Present Invention | 11 | 0.48 | 0.07 | 0.56 | 2.0 | — | — | — | — | — | — | — | — | — | — |
| | 12 | 0.35 | 0.03 | 0.50 | 1.6 | — | — | — | — | — | — | — | — | — | — |
| | 13 | 0.50 | 0.09 | 0.54 | 1.8 | — | — | — | — | — | — | — | — | — | — |
| | 14 | 0.30 | 0.01 | 0.52 | 0.5 | — | — | — | — | — | — | — | — | — | — |
| | 15 | 0.43 | 0.05 | 0.58 | 0.3 | — | — | — | — | — | — | — | — | — | — |
| | 16 | 0.47 | 0.08 | 0.50 | 3.0 | 0.15 | 0.06 | 0.020 | 0.48 | 0.020 | 0.47 | 0.08 | 0.51 | 0.030 | 0.2 |
| | 17 | 0.41 | 0.05 | 0.48 | 2.0 | 0.22 | 0.11 | 0.005 | 0.51 | 0.005 | 0.41 | 0.05 | 0.48 | 0.005 | 0.1 |
| | 18 | 0.34 | 0.03 | 0.52 | 2.5 | 0.23 | 0.11 | 0.015 | 0.60 | 0.080 | 0.34 | 0.03 | 0.54 | 0.100 | 0.5 |
| | 19 | 0.32 | 0.01 | 0.50 | 1.0 | 0.30 | 0.05 | 0.050 | 0.56 | 0.100 | 0.32 | 0.01 | 0.55 | 0.080 | 1.0 |
| | 20 | 0.38 | 0.04 | 0.59 | 1.5 | 0.40 | 0.05 | 0.010 | 0.50 | 0.030 | 0.38 | 0.04 | 0.58 | 0.050 | 0.3 |

TABLE 13

| | | Main Phase of Upper Layer | | | | | Particles of (Al, Cr, Si, Cu)N Layer | | | | | | | | | | |
|---|---|---|---|---|---|---|---|---|---|---|---|---|---|---|---|---|---|
| | | | | | | | CrSi-Rich Particles | | | | | Al-Rich Particles | | | | | |
| | | Composition (Atomic Ratio) | | | | Average Layer Thickness of | Composition (Atomic Ratio) | | | | Area | Composition (Atomic Ratio) | | | | Area | Area Ratio (%) of Particles having Aspect |
| Type | | α Value | β Value | γ Value | x Value | Upper Layer (μm) | α Value | β Value | γ Value | x Value | Ratio (%) | α Value | β Value | γ Value | x Value | Ratio (%) | Ratio of 2 or more |
| Present Invention | 11 | 0.25 | 0.15 | 0.030 | 0.45 | 3.2 | 0.55 | 0.20 | 0.02 | 0.21 | 1.3 | 0.25 | 0.12 | 0.02 | 0.30 | 2.8 | 98 |
| | 12 | 0.18 | 0.10 | 0.020 | 0.49 | 2.4 | 0.32 | 0.26 | 0.03 | 0.02 | 2.0 | 0.18 | 0.09 | 0.05 | 0.02 | 0.5 | 88 |
| | 13 | 0.18 | 0.12 | 0.040 | 0.52 | 3.2 | 0.33 | 0.46 | 0.10 | 0.28 | 1.6 | 0.13 | 0.16 | 0.10 | 0.21 | 1.8 | 90 |
| | 14 | 0.27 | 0.10 | 0.020 | 0.52 | 2.3 | 0.28 | 0.52 | 0.08 | 0.28 | 0.8 | 0.22 | 0.19 | 0.02 | 0.18 | 3.0 | 96 |
| | 15 | 0.24 | 0.20 | 0.010 | 0.54 | 1.5 | 0.35 | 0.20 | 0.06 | 0.10 | 2.0 | 0.18 | 0.05 | 0.05 | 0.18 | 1.5 | 92 |
| | 16 | 0.15 | 0.06 | 0.020 | 0.48 | 2.6 | 0.48 | 0.33 | 0.01 | 0.12 | 1.0 | 0.24 | 0.25 | 0.00 | 0.16 | 2.0 | 90 |
| | 17 | 0.22 | 0.11 | 0.005 | 0.51 | 3.0 | 0.55 | 0.24 | 0.01 | 0.10 | 0.5 | 0.23 | 0.16 | 0.02 | 0.02 | 0.5 | 80 |
| | 18 | 0.23 | 0.11 | 0.015 | 0.60 | 5.0 | 0.28 | 0.55 | 0.02 | 0.35 | 1.8 | 0.14 | 0.12 | 0.03 | 0.10 | 2.1 | 98 |
| | 19 | 0.30 | 0.05 | 0.050 | 0.56 | 2.4 | 0.20 | 0.40 | 0.02 | 0.05 | 1.5 | 0.10 | 0.21 | 0.03 | 0.35 | 1.9 | 95 |
| | 20 | 0.40 | 0.05 | 0.010 | 0.50 | 2.0 | 0.41 | 0.33 | 0.00 | 0.17 | 0.2 | 0.20 | 0.24 | 0.01 | 0.35 | 2.0 | 86 |

Next, regarding the coated tools 11 to 20 according to the present invention, a milling cutting test was performed under the following cutting conditions, and the wear width of a flank face of a cutting edge was measured.

<Cutting Conditions C>
Work material: a block material according to JIS SKH51 (HRC64)
Rotational speed: 5400/min
Cutting speed: 100 m/min
Depth of cut: ae 0.2 mm, ap 2.0 mm
Feed rate (per tooth): 0.05 mm/edge
Cutting fluid: air blow
Cutting length: 20 m <Cutting Conditions D>
Work material: a block material according to JIS SKD11 (HRC60)
Rotational speed: 5400/min
Cutting speed: 100 m/min
Depth of cut: ae 0.3 m, ap 2.0 mm
Feed rate (per tooth): 0.04 mm/edge
Cutting fluid: air blow
Cutting length: 60 m Table 14 shows the results of the cutting test.

TABLE 14

| Type | | Wear Width on Flank Face (mm) | |
|---|---|---|---|
| | | Cutting Conditions (A) | Cutting Conditions (B) |
| Present Invention | 11 | 0.09 | 0.08 |
| | 12 | 0.06 | 0.05 |
| | 13 | 0.10 | 0.09 |
| | 14 | 0.05 | 0.05 |
| | 15 | 0.08 | 0.06 |
| | 16 | 0.12 | 0.08 |
| | 17 | 0.08 | 0.07 |
| | 18 | 0.08 | 0.10 |
| | 19 | 0.12 | 0.09 |
| | 20 | 0.10 | 0.08 |

The following was found from the results shown in Tables 12 to 14. In the coated tools 11 to 15 according to the present invention, the lower layer and the upper layer were formed. In addition, in the coated tools 16 to 20 according to the present invention, the intermediate layer having the alternately laminated structure of the thin layer A and the thin layer B was formed between the lower layer and the upper layer. As a result, the adhesive strength between the layers was improved. Further, the main phase having the predetermined composition and the CrSi-rich particles and the Al-rich particles having the predetermined compositions and the predetermined area ratios were present in the hard coating layer formed of the (Al, Cr, Si, Cu)N layer. As a result, excellent chipping resistance and wear resistance were exhibited during intermittent cutting work of a high hardness material during which high impact and intermittent loads were exerted on a cutting edge.

INDUSTRIAL APPLICABILITY

During intermittent cutting work of a high hardness material such as hardened steel, the coated tool according to the present invention exhibits excellent chipping resistance and wear resistance and can extend the service life. Of course, the coated tool according to the present invention is also applicable to cutting work of another work material or to cutting work under other conditions.

REFERENCE SIGNS LIST

B: CUTTING TOOL BODY
UL: UPPER LAYER
LL: LOWER LAYER
IML: INTERMEDIATE LAYER
AL: ALTERNATELY LAMINATED STRUCTURE OF THIN LAYER A AND THIN LAYER B
A-P: Al-RICH PARTICLES
CS-P: CrSi-RICH PARTICLES
1: AIP APPARATUS
2: HEATER
3: ROTATION TABLE
4: CUTTING TOOL BODY
5A, 5B: MAGNETIC FORCE GENERATING SOURCE
6: Al—Cr—Si—Cu ALLOY TARGET (CATHODE ELECTRODE)
7: Al—Ti—Si ALLOY TARGET (CATHODE ELECTRODE)
8A, 8B: ANODE ELECTRODE
9A, 9B: ARC ELECTRIC POWER SUPPLY
10: BIAS ELECTRIC POWER SUPPLY
11: REACTION GAS INLET
12: EXHAUST GAS OUTLET

The invention claimed is:
1. A surface-coated cutting tool comprising:
a cutting tool body made of any of tungsten carbide cemented carbide, titanium carbonitride cermet, a cubic boron nitride sintered material, and high-speed tool steel; and
a hard coating layer that is provided on a surface of the cutting tool body, wherein
(a) the hard coating layer includes at least a complex nitride layer of Al, Cr, Si, and Cu,
(b) the complex nitride layer of Al, Cr, Si, and Cu includes a main phase, and CrSi-rich particles and Al-rich particles that are dispersed in the main phase,
in a case where each of compositions of the main phase, the CrSi-rich particles, and the Al-rich particles are represented by a composition formula: $(Al_{1-\alpha-\beta-\gamma}Cr_\alpha Si_\beta Cu_\gamma)_{1-x}N_x$ (where each of $\alpha$, $\beta$, $\gamma$, and x represents an atomic ratio),
(c) a composition of the main phase satisfies $0.15 \leq \alpha \leq 0.40$, $0.050 \leq \beta \leq 0.20$, $0.005 \leq \gamma \leq 0.05$, and $0.45 \leq x \leq 0.60$,
(d) a composition of the CrSi-rich particles satisfy $0.20 \leq \alpha \leq 0.55$, $0.20 \leq \beta \leq 0.55$, $0 \leq \gamma \leq 0.10$, and $0.02 \leq x \leq 0.35$,
(e) a composition of the Al-rich particles satisfy $0.10 \leq \alpha \leq 0.25$, $0.05 \leq \beta \leq 0.25$, $0 \leq \gamma \leq 0.10$, and $0.02 \leq x \leq 0.35$, and
(f) in a case where a vertical section of the complex nitride layer of Al, Cr, Si, and Cu is observed, an occupancy area ratio of the CrSi-rich particles having a major axis of 100 nm or more in the vertical section is 0.20 area % or more and 2.0 area % or less; and an occupancy area ratio of the Al-rich particles having a major axis of 100 nm or more in the vertical section is 0.50 area % or more and 3.0 area % or less.
2. The surface-coated cutting tool according to claim 1, wherein in a case where particles having a major axis of 100 nm or more are observed in the vertical section of the complex nitride layer of Al, Cr, Si, and Cu, an area ratio of particles having a sectional aspect ratio of 2 or more is 80 area % or more with respect to a total area of the particles having a major axis of 100 nm or more.

3. The surface-coated cutting tool according to claim 1,
wherein the complex nitride layer of Al, Cr, Si, and Cu is provided as an upper layer,
a lower layer made of a complex nitride layer of Al, Ti, and Si is provided between the cutting tool body and the upper layer, and
in a case where the lower layer is represented by a composition formula: $(Al_{1-a-b}Ti_aSi_b)_{1-y}N_y$, a composition of the lower layer satisfies $0.30 \leq a \leq 0.50$, $0.01 \leq b \leq 0.10$, and $0.45 \leq y \leq 0.60$ (where each of a, b, and y represents an atomic ratio).

4. The surface-coated cutting tool according to claim 3,
wherein an intermediate layer having an alternately laminated structure of a thin layer A and a thin layer B is provided between the lower layer and the upper layer,
(a) in a case where the thin layer A is represented by a composition formula: $(Al_{1-\alpha-\beta-\gamma}Cr_\alpha Si_\beta Cu_\gamma)_{1-x}N_x$, a composition of the thin layer A satisfies $0.15 \leq \alpha \leq 0.40$, $0.05 \leq \beta \leq 0.20$, $0.005 \leq \gamma \leq 0.05$, and $0.45 \leq x \leq 0.60$ (where each of $\alpha$, $\beta$, $\gamma$, and x represents an atomic ratio) and the thin layer A is formed of a complex nitride layer of Al, Cr, Si, and Cu with an average one-layer thickness of 0.005 to 0.10 μm, and
(b) in a case where the thin layer B is represented by a composition formula: $(Al_{1-a-b}Ti_aSi_b)_{1-y}N_y$, a composition of the thin layer B satisfies $0.30 \leq a \leq 0.50$, $0.01 \leq b \leq 0.10$, and $0.45 \leq y \leq 0.60$ (where each of a, b, and y represents an atomic ratio) and the thin layer B is formed of a complex nitride layer of Al, Ti, and Si with an average one-layer thickness of 0.005 to 0.10 μm.

* * * * *